(12) United States Patent
Derkacs et al.

(10) Patent No.: US 10,770,612 B1
(45) Date of Patent: Sep. 8, 2020

(54) MULTIJUNCTION SOLAR CELLS HAVING AN INDIRECT HIGH BAND GAP SEMICONDUCTOR EMITTER LAYER IN THE UPPER SOLAR SUBCELL

(71) Applicant: SolAero Technologies Corp., Albuquerque, NM (US)

(72) Inventors: Daniel Derkacs, Albuquerque, NM (US); Daniel Aiken, Cedar Crest, NM (US); Samantha Whipple, Albuquerque, NM (US); Nathaniel Miller, Albuquerque, NM (US); Bed Pantha, Chandler, AZ (US); Mark Stan, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 57 days.

(21) Appl. No.: 16/352,292

(22) Filed: Mar. 13, 2019

Related U.S. Application Data

(63) Continuation-in-part of application No. 15/586,731, filed on May 4, 2017, now Pat. No. 10,263,134.

(60) Provisional application No. 62/341,161, filed on May 25, 2016.

(51) Int. Cl.
*H01L 31/0687* (2012.01)
*H01L 31/0693* (2012.01)
*H01L 31/0725* (2012.01)
*H01L 31/054* (2014.01)
*H01L 31/0735* (2012.01)
*H01L 31/0304* (2006.01)
*H01L 31/047* (2014.01)

(52) U.S. Cl.
CPC .... *H01L 31/0725* (2013.01); *H01L 31/03046* (2013.01); *H01L 31/047* (2014.12); *H01L 31/0547* (2014.12); *H01L 31/0735* (2013.01)

(58) Field of Classification Search
CPC ............... H01L 31/0725; H01L 31/047; H01L 31/0547; H01L 31/03046; H01L 31/0735
See application file for complete search history.

(56) References Cited

U.S. PATENT DOCUMENTS

| 2014/0076387 | A1* | 3/2014 | King | H01L 31/078 136/255 |
| 2016/0155881 | A1* | 6/2016 | Kayes | H01L 31/0445 257/184 |
| 2018/0212091 | A1* | 7/2018 | Escarra | H01L 31/02168 |

* cited by examiner

Primary Examiner — Jayne L Mershon

(57) ABSTRACT

The present disclosure provides a multijunction solar cell comprising: an upper solar subcell having an indirect band gap semiconductor emitter layer composed of greater than 0.7 but less than 1.0 mole fraction aluminum and a base layer, the emitter layer and the base layer forming a heterojunction solar subcell; and a lower solar subcell disposed beneath the upper solar subcell, wherein the lower solar subcell has an emitter layer and a base layer forming a photoelectric junction. In some embodiments, the emitter layer of the upper solar subcell is an n-type $Al_xGa_{1-x}As$ layer with $0.7<x<1.0$ and having a band gap of greater than 1.85 eV.

16 Claims, 4 Drawing Sheets

MULTIJUNCTION SOLAR CELLS HAVING AN INDIRECT HIGH BAND GAP SEMICONDUCTOR EMITTER LAYER IN THE UPPER SOLAR SUBCELL

REFERENCE TO RELATED APPLICATIONS

This application is a continuation-in-part of U.S. patent application Ser. No. 15/586,731 filed May 4, 2017.

The Ser. No. 15/586,731 application claims the benefit of U.S. Provisional Application No. 62/341,161, filed May 25, 2016.

All of the above noted applications are incorporated herein by reference in their entirety.

BACKGROUND OF THE INVENTION

1. Field of the Invention

The present disclosure relates to solar cells and the fabrication of solar cells, and more particularly to multijunction solar cells having an indirect high band gap semiconductor emitter layer in the upper solar subcell.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided by the photovoltaic power system. Thus, as payloads become more sophisticated, weight or mass of the photovoltaic power system, and more particularly the power-to-weight ratio of the solar cells becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum by the subcells in a multijunction solar cell. As such, the characteristic of sunlight absorption in semiconductor material, also known as photovoltaic properties, is critical to determine the most efficient number and sequence of subcells, and the semiconductor material (with specific bandgap, thickness, and electrical properties) in each subcell, to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The present disclosure proposes additional design features for multijunction solar cells capable of increasing the efficiency of the multijunction solar cell in converting solar energy (or photons) to electrical energy.

SUMMARY OF THE INVENTION

Briefly, and in general terms, the present disclosure provides a multijunction solar cell comprising: an upper solar subcell having an indirect band gap semiconductor emitter layer and a base layer, the emitter layer and the base layer forming a heterojunction solar subcell, wherein the emitter layer of the upper solar subcell is an n-type AlxGa1-xAs layer with $0.7<x<1.0$ and having a band gap of greater than 1.85 eV and is doped with an n-type dopant selected from the group consisting of Se, Te, S, Sn, and combinations thereof, and wherein the base layer of the upper solar subcell is a p-type AlyGazIn1-y-zP layer with $0<y<0.5$ and $0<z<1$; and a lower solar subcell disposed beneath the upper solar subcell, wherein the lower solar subcell has an emitter layer and a base layer forming a photoelectric junction.

In some embodiments, the emitter layer of the upper solar subcell is an n-type $Al_xGa_{1-x}As$ layer with $0.7<x<1.0$ and having a band gap of greater than 1.85 eV.

In some embodiments, the emitter layer of the upper solar subcell is doped with an n-type dopant selected from the group consisting of Se, Te, S, Si, Sn, and combinations thereof.

In some embodiments, the base layer of the upper solar subcell is a p-type $Al_yGa_zIn_{1-y-z}P$ layer with $0<y<0.5$ and $0<z<1$.

In some embodiments, the base layer of the upper solar subcell is a p-type $Al_yGa_{1-y}As$ layer with $0<y<0.4$.

In some embodiments, the base layer of the upper solar subcell is doped with a p-type dopant selected from the group consisting of Zn, Be, Mg, and combinations thereof.

In some embodiments, the emitter layer of the lower solar subcell is an n-type InGaP or AlGaAs layer.

In some embodiments, the base layer of the lower solar subcell is a p-type AlGaAs layer.

In some embodiments, the multijunction solar cell further comprises an AlInP window layer disposed above the upper solar subcell.

In some embodiments, the emitter layer of the lower solar subcell is doped with an n-type dopant selected from the group consisting of Se, Te, S, Si, Sn, and combinations thereof.

In another embodiment, the present disclosure provides a multijunction solar cell comprising: a first upper solar subcell having an indirect band gap semiconductor emitter layer and a base layer forming a heterojunction solar subcell, wherein the emitter layer is an n-type $Al_xGa_{1-x}As$ layer with $0.7<x<1.0$ and having a band gap of greater than 2.0 eV; a second middle solar subcell disposed beneath the first upper solar subcell, wherein the second middle solar subcell has an emitter layer and a base layer forming a photoelectric junction; and a third lower solar subcell disposed beneath the second middle solar subcell, wherein the third lower solar subcell has an emitter layer and a base layer forming a photoelectric junction.

In some embodiments, the above-disclosed multijunction solar cells are upright multijunction solar cells.

In some embodiments, the above-disclosed multijunction solar cells are upright metamorphic multijunction solar cells.

In some embodiments, the above-disclosed multijunction solar cells are inverted metamorphic multijunction solar cells.

In some embodiments, the above-disclosed multijunction solar cells are III-V compound semiconductor multijunction solar cells.

In still another embodiment, the present disclosure provides a multijunction solar cell comprising: a first upper solar subcell having an indirect band gap semiconductor emitter layer and a base layer forming a heterojunction solar subcell, wherein the emitter layer is an n-type $Al_xGa_{1-x}As$ layer with $0.7<x<1.0$ and having a band gap of greater than 2.0 eV, and the base layer is a p-type $Al_yGa_zIn_{1-y-z}P$ layer with $0<y<0.5$; a second middle solar subcell disposed beneath the first upper solar subcell, wherein the second middle solar subcell has an emitter layer and a base layer forming a photoelectric junction; a third middle solar subcell disposed beneath the second middle solar subcell, wherein the third middle solar subcell has an emitter layer and a base layer forming a photoelectric junction, and a fourth lower solar subcell disposed beneath the third middle solar subcell, wherein the fourth lower solar subcell has an emitter layer and a base layer forming a photoelectric junction.

In some embodiments, the multijunction solar cell further comprises a distributed bragg reflector (DBR) layer disposed between the third middle solar subcell and the fourth lower solar subcell.

In certain embodiments, the distributed bragg reflector (DBR) layer is constructed such that (i) at least a portion of light of a first spectral wavelength range that enters and passes through the third middle solar subcell is reflected back into the third middle solar subcell by the DBR layer; and (ii) at least a portion of light of a second spectral wavelength range that enters and passes through the third middle solar subcell is transmitted through the DBR layer to layers disposed beneath the DBR layer, wherein the second spectral wavelength range is composed of greater wavelengths than the wavelengths of the first spectral wavelength range.

In certain embodiments, the multijunction solar cells having an indirect high band gap semiconductor emitter layer in the upper solar subcell can provide advantages over known multijunction solar cells, for example, by achieving high material quality.

BRIEF DESCRIPTION OF THE DRAWING

The invention will be better and more fully appreciated by reference to the following detailed description when considered in conjunction with the accompanying drawings, wherein.

DESCRIPTION OF ILLUSTRATIVE EMBODIMENTS

High efficiency solar cell designs incorporating two or more subcells lattice matched to Ge/GaAs may require the use of aluminum in the high bandgap top subcells, for example, $Al_xInGa_{1-x}P$ having 1.90 eV$<E_g<$2.30 eV; and with $0<x<0.5$ (J1 subcell); and $Al_yInGa_{1-y}As$ having 1.41 eV$<E_g<$1.89 eV; and with $0<y<0.4$ (J2 subcell).

High efficiency solar cell designs incorporating two or more subcells lattice mismatched to Ge/GaAs may also incorporate these materials by increasing the mole fraction of indium in metamorphic solar cells.

Adding aluminum to these materials may make them more susceptible to oxygen incorporation during growth, which may result in reduced minority carrier lifetimes and poor material quality (quantum efficiency, voltage, higher $E_g$-$V_{oc}$, low FF, etc.).

Figure 1:
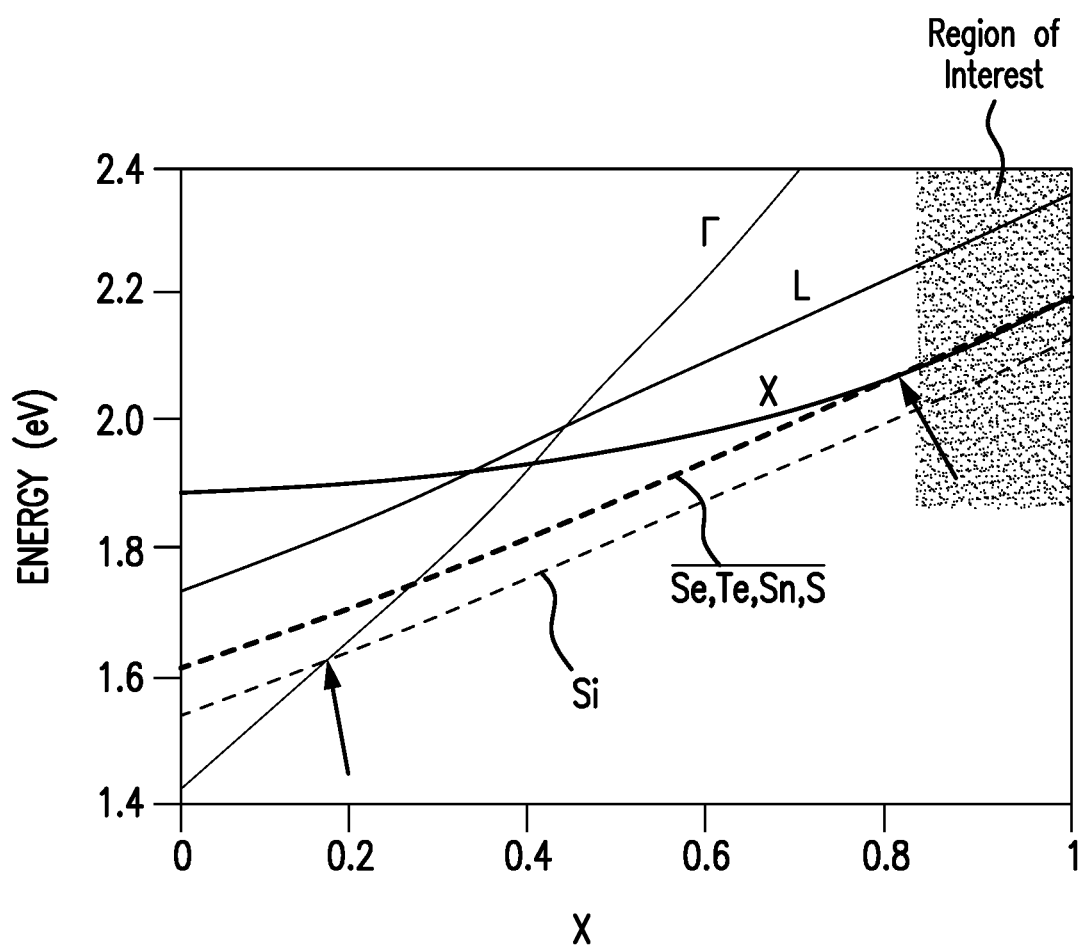
FIG. 1 is a graphical illustration of the conduction bands for AlGaAs as a function of mole fraction aluminum for various dopants incorporated into the material.

In addition, as shown in FIG. 1, above a certain mole fraction of aluminum, AlGaAs can suffer from electronically active DX center defects when n-type dopants are incorporated into the material (the defect is named after a complex formed between the donor dopant D and an unknown defect X). When the DX center energy level associated with the dopant species resides below the conduction band of the material, it may act as an efficient majority and minority carrier recombination center, which may reduce the active doping level of the material and degrade the electronic properties of the material. The DX center is the result of a physical deformation of the crystal lattice and is found to be largely independent of material growth parameters. Not all dopant species are found have the same energy level, so changing the doping species from the popular dopant Si, to Se, Te, Sn, or S may allow one to incorporate a slightly greater amount of aluminum before noticing the effects of the DX center. For example, switching from Si to Se may enable high quality compounds with 0.25 mole fraction aluminum (e.g., $Al_{0.25}Ga_{0.75}As$) to be grown vs. compounds with 0.2 mole fraction aluminum (e.g., $Al_{0.2}Ga_{0.8}As$) for Si.

Traditional multijunction designs that incorporate high bandgap n-type emitters that can have greater than 0.2 mole fraction aluminum (e.g., AlInGaP and AlGaAs) may result in degraded solar cell parameters including quantum efficiency (QE), efficiency (EFF), fill factor (FF), and/or open-circuit voltage ($V_{oc}$).

Heckelman et al. recently investigated the use of an approximately 1.9 eV $Al_{0.4}Ga_{0.6}As$ to replace the more expensive InGaP solar cells. To mitigate the effects of n-type $Al_{0.4}Ga_{0.6}As$ emitters, however, n-type AlGaAs emitters were eliminated entirely and instead a heterojunction InGaP/AlGaAs 1.9 eV solar cell was grown. The Heckelman et al. device may be acceptable for J2 subcells but not acceptable for high bandgap top solar cells made from AlInGaP having 1.92 eV<$E_g$<2.2 eV.

Although Venkatasubramanian et al. investigated the use of high Al AlGaAs emitters in 1994, the cell structure was an n-on-p $Al_{0.8}Ga_{0.2}As/Al_{0.2}Ga_{0.8}As$ solar cell. The use of n-on-p AlGaAs on AlInGaP in the present disclosure, was not mentioned. In addition, the Venkatasubramanian et al. device does not employ an InAlP window layer above the AlGaAs emitter which may degrade performance and lead to darkening and degradation of AlGaAs in humidity.

This disclosure describes some advantages of employing very high indirect bandgap semiconductor n-type $Al_xGa_{1-x}As$ (0.7<x<1.0; $E_g$>1.85 eV) emitters, which may mitigate the aforementioned deleterious effects of DX centers in either (Al)GaInP or (Al)GaAs solar subcells. In this regard, a heterojunction solar subcell can be formed by creating n-on-p junction from either $Al_xGa_{1-x}As/Al_yGa_zIn_{1-y-z}P$ (0.7<x<1.0; 0<y<0.5; 0<z<1) or $Al_xGa_{1-x}As/Al_yGa_{1-y}As$ (0.7<x<1.0; 0<y<0.4), with the semiconductor n-type $Al_xGa_{1-x}As$ emitter (0.7<x<1.0) being doped n-type by any suitable n-type dopant including Se/Te/S/Si and the p-type base being doped by any suitable p-type dopant including Zn, Be, or Mg.

FIG. 1 plots three conduction band energy levels of AlGaAs vs. mole fraction of aluminum. The direct gamma band (I band) has the lowest energy band up to approximately 0.4 mole fraction aluminum. Thereafter, the material becomes indirect due to the X band being lower than the direct gamma or indirect L bands (i.e. the material becomes a weak light absorber and nearly transparent for typical thickness used to create solar cell emitter layers of less than approximately 200 nm). Also shown are the energy levels associated with n-type dopants. In some embodiments, if the energy level of the dopant resides below the direct or indirect bandgap (within the bandgap), then the deleterious DX centers will be electronically active. However, for compositions above 0.7 mole fraction aluminum, n-type dopants including Se and Te may have energy levels that are once again above the lowest bandgap energy of the material, thus potentially avoiding material degradation. Also, Si may reside close enough to the X band as the experimental errors in determining the exact energy level associated with DX centers can be high. In some embodiments, the defect levels associated with n-type dopants remain at a relatively fixed energy level below the L band may be indicated by an empirical trend.

In some cases, achieving high material quality in the n-type emitter of high bandgap solar cells is extremely important as it can limit the performance of the entire multijunction device. The n-type $Al_xGa_{1-x}As$ emitter with 0.7<x<1.0 can mitigate the deleterious effects of DX centers and also provide a nearly transparent layer, enabling more light to be collected by p-type base materials that have longer minority carrier electron diffusion lengths (e.g., electrons may have higher mobility than holes and thus inherently longer diffusion lengths). Thus, both the beginning and end of life performance can be improved with the inclusion of $Al_xGa_{1-x}As$ emitters with 0.7<x<1.0. In addition, because the emitter may be optically transparent it can be made much thicker and doped much higher without a reduction in quantum efficiency typically experienced in non-indirect bandgap materials. This may lead to a significant reduction in emitter sheet resistance, fewer gridline obscuration loss, and improved FF and solar cell efficiency.

The emitter design described herein can be extended to various applications, such as traditional 3J InGaP/InGaAs/Ge solar cells for space and terrestrial use. In many embodiments, this emitter design could be used for any III-V solar cell, with any number of junctions, which may benefit from the higher quantum efficiency, higher FF, higher voltage, lower sheet resistance and/or requirement of high bandgap top cell(s).

Figure 2:
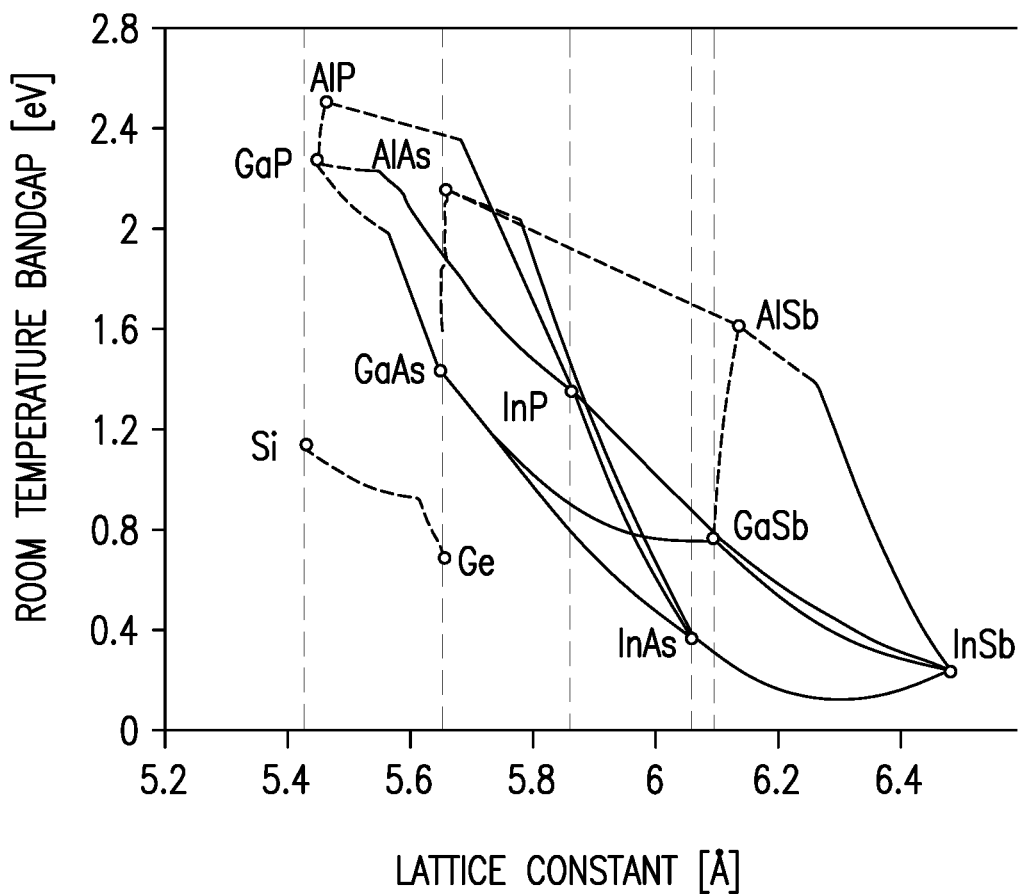
FIG. 2 is a graphical illustration representing the band gap of certain binary materials and their lattice constants.

FIG. 2 is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

Figure 3:
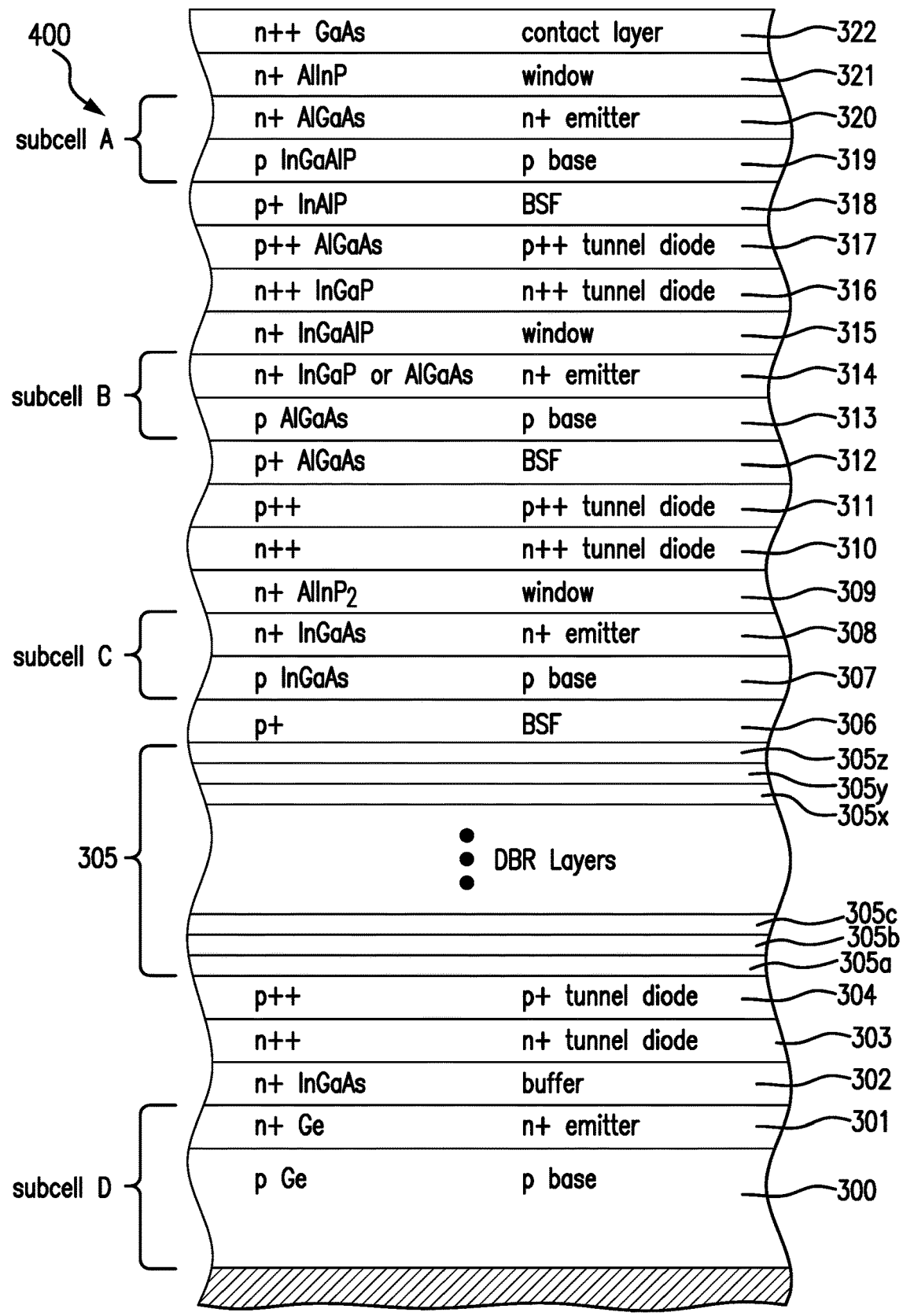
FIG. 3 is a cross-sectional view of the solar cell of a four junction solar cell after several stages of fabrication including the deposition of certain semiconductor layers on the growth substrate up to the contact layer, according to the present disclosure.

An exemplary multijunction solar cell is illustrated in FIG. 3. It should be understood that the multijunction solar cell can include additional layers above, below, or in between the illustrated layers, and that such additional layers have not been illustrated in FIG. 3 for simplicity and clarity.

As shown in an embodiment of a four junction upright lattice matched multijunction solar cell in the illustrated example of FIG. 3, the bottom subcell D includes a substrate 300 formed of p-type germanium ("Ge"), which also serves as a base layer. A back metal contact pad 350 formed on the bottom of base layer 300 provides electrical contact to the multijunction solar cell 400. The bottom subcell D, further includes, for example, a highly doped n-type Ge emitter layer 301, and an n-type indium gallium arsenide ("InGaAs") nucleation layer 302. The nucleation layer is deposited over the base layer, and the emitter layer is formed in the substrate by diffusion of deposits into the Ge substrate, thereby forming the n-type Ge layer 301. Heavily doped p-type aluminum gallium arsenide ("AlGaAs") and heavily doped n-type gallium arsenide ("GaAs") tunneling junction layers 303, 304 may be deposited over the nucleation layer to provide a low resistance pathway between the bottom and middle subcells.

Distributed Bragg reflector (DBR) layers 305 are then grown adjacent to and between the tunnel diode 303, 304 of the bottom subcell D and the third solar subcell C. The DBR layers 305 are arranged so that light can enter and pass through the third solar subcell C and at least a portion of which can be reflected back into the third solar subcell C by the DBR layers 305. In the embodiment depicted in FIG. 3, the distributed Bragg reflector (DBR) layers 305 are specifically located between the third solar subcell C and tunnel diode layers 304, 303; in other embodiments, the distributed Bragg reflector (DBR) layers may be located between tunnel diode layers 304/303 and buffer layer 302.

A Distributed Bragg Reflector (or DBR) is a specially formulated sequence of thin film layers that offers a high degree of reflectance over a specific wavelength range. The central wavelength in free space (air), $\lambda_{central}$, of the reflectivity band can be adjusted by employing two or more materials that have a difference in their optical index of refraction. The reflector may be realized by placing repeating alternating pairs of each material. The thickness of each layer is ¼ of the central wavelength inside the material, or $t=\lambda_{central}/\{4n(\lambda_{central})\}$, where t is the layer thickness and $n(\lambda_{central})$ is the index of refraction of the layer at the central wavelength.

DBR reflectivity is calculated from Maxwell's equations via the transfer matrix method. It can also be approximated by the following equation:

$$R = \left[\frac{n_o(n_2)^{2N} - n_s(n_1)^{2N}}{n_o(n_2)^{2N} + n_s(n_1)^{2N}}\right]^2,$$

where $n_{0,1,2,s}$ are the refractive indices of the originating material, the two alternating materials, and the substrate material; and N is the number of repeated pairs. The frequency bandwidth, $\Delta f_0$, of the reflection band can be approximated by:

$$\frac{\Delta f_0}{f_0} = \frac{4}{\pi}\arcsin\left(\frac{n_2 - n_1}{n_2 + n_1}\right),$$

where $f_0$ is the central frequency of the band. Adding and subtracting $\Delta f_0$ from $f_0$ and converting the two frequencies into wavelength via $c=f\lambda$, one arrives at approximate bandwidth of reflector in free space.

For some embodiments, distributed Bragg reflector (DBR) layers 305 can be composed of a plurality of alternating layers 305a through 305z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 305a through 305z includes a first DBR layer composed of a plurality of p type $Al_xGa_{1-x}As$ layers, and a second DBR layer disposed over the first DBR layer and composed of a plurality of p type $Al_yGa_{1-y}As$ layers, where y is greater than x.

In the illustrated example of FIG. 3, the subcell C includes a highly doped p-type aluminum gallium arsenide ("AlGaAs") back surface field ("BSF") layer 306, a p-type InGaAs base layer 307, a highly doped n-type indium gallium arsenide ("InGaAs") emitter layer 308 and a highly doped n-type indium aluminum phosphide ("AlInP2") window layer 309. The InGaAs base layer 307 of the subcell C can include, for example, approximately 0.015 mole fraction indium. Other compositions may be used as well. The base layer 307 is formed over the BSF layer 306 after the BSF layer is deposited over the DBR layers 305.

The window layer 309 is deposited on the emitter layer 308 of the subcell C. The window layer 309 in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers 310, 311 may be deposited over the subcell C.

The middle subcell B includes a highly doped p-type aluminum gallium arsenide ("AlGaAs") back surface field ("BSF") layer 312, a p-type AlGaAs base layer 313, a highly doped n-type indium gallium phosphide ("InGaP2") or AlGaAs layer 314 and a highly doped n-type indium gallium aluminum phosphide ("AlGaAlP") window layer 315. The InGaP emitter layer 314 of the subcell B can include, for example, approximately 0.5 mole fraction indium. Other compositions may be used as well.

Before depositing the layers of the top cell A, heavily doped n-type InGaP and p-type AlGaAs tunneling junction layers 316, 317 may be deposited over the subcell B.

In the illustrated example, the top subcell A includes a highly doped p-type indium aluminum phosphide ("InAlP2") BSF layer 318, a base layer 319, and an indirect high band gap semiconductor emitter layer 320 forming a heterojunction solar subcell. The base layer 319 of the top subcell A is deposited over the BSF layer 318 after the BSF layer 318 is formed.

The base layer 319 can be a p-type InGaAlP layer. In certain embodiments, base layer 319 is a p-type $Al_yGa_zIn_{1-y-z}P$ layer with $0<y<0.5$ and $0<z<1$. Base layer 319 can be doped with a p-type dopant selected from the group consisting of Zn, Be, Mg, and combinations thereof.

Indirect high band gap semiconductor emitter layer 320 is deposited over base layer 319. Emitter layer 320 is an n-type $Al_xGa_{1-x}As$ layer with $0.8<x<1.0$ and having a band gap of greater than 2.0 eV. In some embodiments, emitter layer 320 is doped with an n-type dopant selected from the group consisting of Se, Te, S, Si, Sn, and combinations thereof.

A highly doped n-type InAlP2 window layer 321 is deposited over subcell A.

After the cap or contact layer 322 is deposited, the grid lines are formed via evaporation and lithographically patterned and deposited over the cap or contact layer 322.

Figure 4:
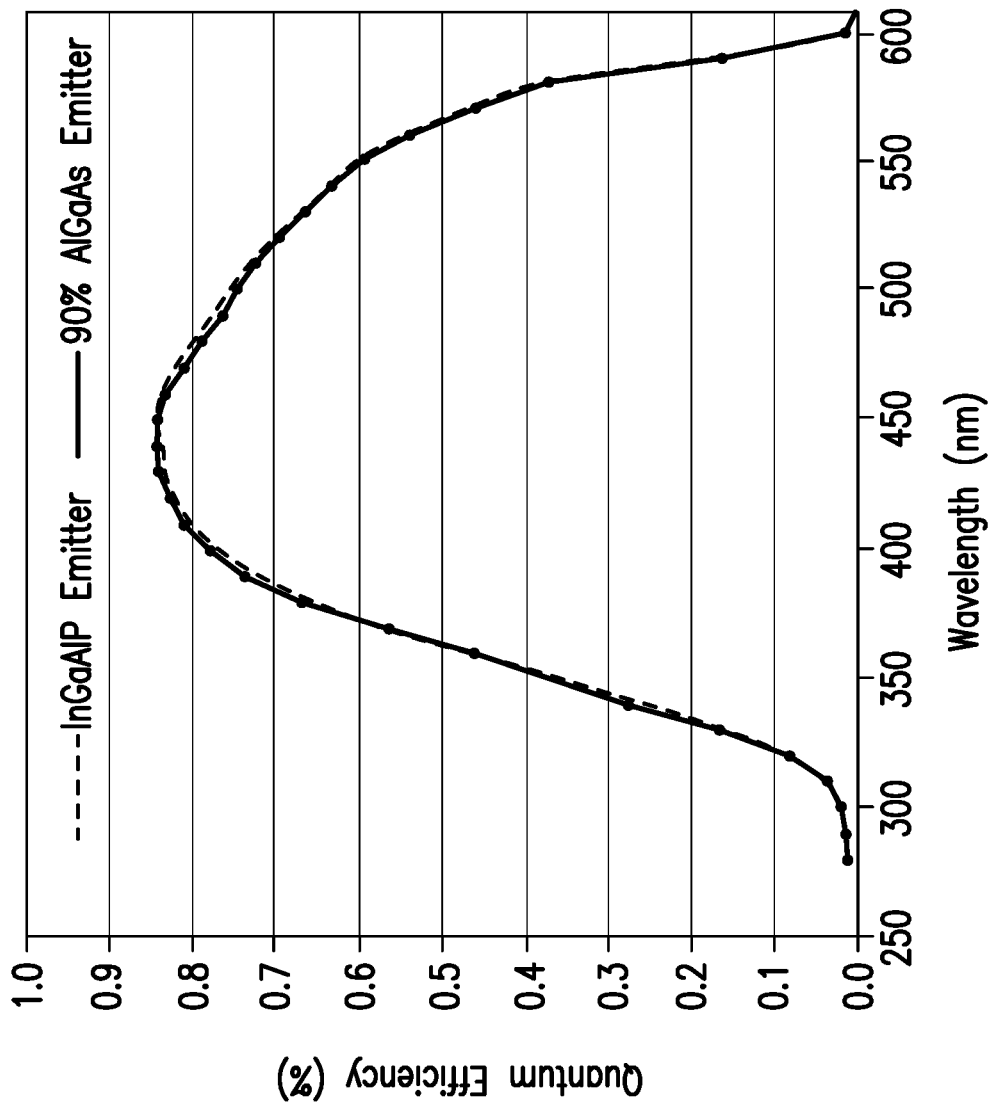
FIG. 4 is a graph depicting the experimentally measured quantum efficiency of an AlGaAs emitter with 90% aluminum by mole fraction compared with that of a conventional InGaAlP emitter.

FIG. 4 is a graph depicting the experimentally measured quantum efficiency of an AlGaAs emitter with 90% aluminum by mole fraction compared with that of a conventional InGaAlP emitter. The results demonstrate the efficacy of the emitter composition according to the present disclosure.

In some embodiments, the multijunction solar cell is an upright multijunction solar cell. In some embodiments, the multijunction solar cell is an upright metamorphic multijunction solar cell. In some embodiments, multijunction solar cell is an inverted metamorphic solar cell.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A multijunction solar cell comprising:
    an upper solar subcell having an indirect band gap semiconductor emitter layer and a base layer, the emitter layer and the base layer forming a heterojunction solar subcell,
    wherein the emitter layer of the upper solar subcell is an n-type $Al_xGa_{1-x}As$ layer with $0.7<x<1.0$ and having a band gap of greater than 1.85 eV and is doped with an n-type dopant selected from the group consisting of Se, Te, S, Sn, and combinations thereof, and wherein the base layer of the upper solar subcell is a p-type $Al_yGa_zIn_{1-y-z}P$ layer with $0<y<0.5$ and $0<z<1$; and a lower solar subcell disposed beneath the upper solar subcell, wherein the lower solar subcell has an emitter layer and a base layer forming a photoelectric junction.

2. The multijunction solar cell of claim 1 wherein the base layer of the upper solar subcell is doped with a p-type dopant selected from the group consisting of Zn, Be, Mg, and combinations thereof.

3. The multijunction solar cell of claim 1 wherein the emitter layer of the lower solar subcell is an n-type InGaP or AlGaAs layer.

4. The multijunction solar cell of claim 1 wherein the emitter layer of the lower solar subcell is doped with an n-type dopant selected from the group consisting of Se, Te, S, Si, Sn, and combinations thereof.

5. The multijunction solar cell of claim 1 wherein the base layer of the lower solar subcell is a p-type AlGaAs layer.

6. The multijunction solar cell of claim 1 wherein the base layer of the lower solar subcell is doped with a p-type dopant selected from the group consisting of Zn, Be, Mg, and combinations thereof.

7. The multijunction solar cell of claim 1 further comprising an AlInP window layer disposed above the upper solar subcell.

8. A multijunction solar cell comprising:
a first upper solar subcell having an indirect band gap semiconductor emitter layer and a base layer forming a heterojunction solar subcell, wherein the emitter layer is an n-type $Al_xGa_{1-x}As$ layer with $0.7<x<1.0$ and having a band gap of greater than 2.0 eV,
wherein the emitter layer is doped with an n-type dopant selected from the group consisting of Se, Te, S, Si, Sn, and combinations thereof, and
wherein the base layer of the upper solar subcell is a p-type $Al_yGa_zIn_{1-y-z}P$ layer with $0<y<0.5$ and $0<z<1$;
a second middle solar subcell disposed beneath the first upper solar subcell, wherein the second middle solar subcell has an emitter layer and a base layer forming a photoelectric junction; and
a third lower solar subcell disposed beneath the second middle solar subcell, wherein the third lower solar subcell has an emitter layer and a base layer forming a photoelectric junction.

9. The multijunction solar cell of claim 8, wherein the multijunction solar cell is an upright multijunction solar cell.

10. The multijunction solar cell of claim 8, wherein the multijunction solar cell is an upright metamorphic multijunction solar cell.

11. The multijunction solar cell of claim 8, wherein the multijunction solar cell is an inverted metamorphic multijunction solar cell.

12. The multijunction solar cell of claim 8, wherein the multijunction solar cell is a III-V compound semiconductor multijunction solar cell.

13. A multijunction solar cell comprising:
a first upper solar subcell having an indirect band gap semiconductor emitter layer and a base layer forming a heterojunction solar subcell, wherein the emitter layer is an n-type $Al_xGa_{1-x}As$ layer with $0.7<x<1.0$ and having a band gap of greater than 1.85 eV and is doped with an n-type dopant selected from the group consisting of Se, Te, S, Si, Sn, and combinations thereof, and the base layer is a p-type $Al_yGa_zIn_{1-y-z}P$ layer with $0<y<0.5$ and $0<z<1$;
a second middle solar subcell disposed beneath the first upper solar subcell, wherein the second middle solar subcell has a highly doped p-type AlGaAs back surface field layer, a highly doped n-type InGaP or AlGaAs layer emitter layer, a p-type AlGaAs base layer forming a photoelectric junction, and a highly doped n-type AlGaAlP window layer;
a third middle solar subcell disposed beneath the second middle solar subcell, wherein the third middle solar subcell has an emitter layer and a base layer forming a photoelectric junction; and
a fourth lower solar subcell disposed beneath the third middle solar subcell, wherein the fourth lower solar subcell has an emitter layer and a base layer forming a photoelectric junction.

14. The multijunction solar cell of claim 13 further comprising a distributed bragg reflector (DBR) layer disposed between the third middle solar subcell and the fourth lower solar subcell.

15. The multijunction solar cell of claim 14 wherein the distributed bragg reflector (DBR) layer is constructed such that (i) at least a portion of light of a first spectral wavelength range that enters and passes through the third middle solar subcell is reflected back into the third middle solar subcell by the DBR layer; and (ii) at least a portion of light of a second spectral wavelength range that enters and passes through the third middle solar subcell is transmitted through the DBR layer to layers disposed beneath the DBR layer, wherein the second spectral wavelength range is composed of greater wavelengths than the wavelengths of the first spectral wavelength range.

16. The multijunction solar cell of claim 13 wherein the band gap of the emitter layer is above a DX center energy level for the n-type dopant.

* * * * *